(12) United States Patent
Glatkowski et al.

(10) Patent No.: US 6,762,237 B2
(45) Date of Patent: Jul. 13, 2004

(54) NANOCOMPOSITE DIELECTRICS

(75) Inventors: Paul J. Glatkowski, Littleton, MA (US); David J. Arthur, Norwood, MA (US)

(73) Assignee: Eikos, Inc., Franklin, MA (US)

( * ) Notice: Subject to any disclaimer, the term of this patent is extended or adjusted under 35 U.S.C. 154(b) by 0 days.

(21) Appl. No.: 10/165,306

(22) Filed: Jun. 10, 2002

(65) Prior Publication Data

US 2003/0008123 A1 Jan. 9, 2003

Related U.S. Application Data

(60) Provisional application No. 60/296,480, filed on Jun. 8, 2001.

(51) Int. Cl.$^7$ .................................................. C08K 3/04
(52) U.S. Cl. ...................................... 524/496; 524/495
(58) Field of Search ............................... 524/495, 496; 523/218

(56) References Cited

U.S. PATENT DOCUMENTS

| | | | |
|---|---|---|---|
| 5,292,854 A | 3/1994 | Keller | |
| 5,547,525 A | 8/1996 | Bennett et al. | |
| 5,560,898 A | 10/1996 | Uchida et al. | |
| 5,640,705 A | 6/1997 | Koruga | |
| 5,695,734 A | 12/1997 | Ikazaki et al. | |
| 5,753,088 A | 5/1998 | Olk | |
| 5,773,834 A | 6/1998 | Yamamoto et al. | |
| 5,849,830 A | 12/1998 | Tsipursky et al. | |
| 5,853,877 A | 12/1998 | Shibuta | |
| 5,908,585 A | 6/1999 | Shibuta | |
| 5,939,508 A | 8/1999 | Keller | |
| 5,965,202 A | 10/1999 | Taylor-Smith et al. | |
| 6,031,711 A | 2/2000 | Tennent et al. | |
| 6,038,060 A | 3/2000 | Crowley | |
| 6,099,965 A | 8/2000 | Tennent et al. | |
| 6,124,365 A | 9/2000 | Lan et al. | |
| 6,205,016 B1 | 3/2001 | Niu | |
| 6,250,984 B1 | 6/2001 | Jin et al. | |
| 6,265,466 B1 | 7/2001 | Glatkowski et al. | |
| 6,280,677 B1 | 8/2001 | Yakobson | |
| 6,283,812 B1 | 9/2001 | Jin et al. | |
| 6,299,812 B1 | 10/2001 | Newman et al. | |
| 6,333,016 B1 | 12/2001 | Resasco et al. | |
| 6,350,516 B1 | 2/2002 | Weber et al. | |
| 6,395,199 B1 | 5/2002 | Krassowski et al. | |
| 6,426,134 B1 | 7/2002 | Lavin et al. | |
| 2002/0161101 A1 * | 10/2002 | Carroll et al. ............... 524/495 |

FOREIGN PATENT DOCUMENTS

| | | |
|---|---|---|
| EP | 0 949 199 A1 | 10/1999 |
| WO | WO 99/65821 | 12/1999 |
| WO | WO 01/92381 | 12/2001 |

OTHER PUBLICATIONS

Peter Fairley, "*Nanotechnology: The Start of Something Big*," Chemicalweek pp. 23–26 (Dec. 12, 2001).
Pulickel M. Ajayan, "*Aligned Carbon Nanotubes in a Thin Polymer Film*," Advanced Materials, vol. 7, No. 5, pp. 489–491 (1995).
J. Sandler et al., "*Development of a Dispersion Process for Carbon Nanotubes in an Epoxy Matrix and the Resulting Electrical Properties*," Polymer 40, pp. 5967–5971 (1999).
Kevin Ausman et al., "*Organic Solvent Dispersions of Single–Walled Carbon Nanotubes: Toward Solutions of Pristine Nanotubes,*" Journal of Physical Chemistry, vol. 104, No. 38, pp. 8911–8915 (Sep. 28, 2000).
Philip Ball, "*Through the Nanotube,*" New Scientist, pp. 28–31 (Jul. 6, 1996).
B.I. Yakobson et al., "*Fullerene Nanotubes: $C_{1,000,000}$ and Beyond,*" American Scientist, vol. 85, pp. 324–337 (Jul.–Aug. 1997).
P.M. Ajayan et al., "*Nanometre–size tubes of carbon,*" Rep. Prog. Phys., vol. 60, pp. 1025–1062 (1997).

* cited by examiner

*Primary Examiner*—Katarzyna Wyrozebski
(74) *Attorney, Agent, or Firm*—Morrison & Foerster LLP (57) ABSTRACT

The present invention relates to a novel nanocomposite dielectric comprising a polymer matrix and a plurality of carbon nanotubes dispersed therein. A method for increasing a dielectric constant of a polymer matrix, as well as a laminate and mobile antenna comprising the novel dielectric are also disclosed.

48 Claims, 6 Drawing Sheets

NANOCOMPOSITE DIELECTRICS

CROSS REFERENCE TO RELATED APPLICATIONS

The instant application claims the benefit of provisional application 60/296,480 filed Jun. 8, 2001, the disclosure of which is incorporated herein by reference in its entirety.

STATEMENT AS TO RIGHTS TO INVENTIONS MADE UNDER FEDERALLY SPONSORED RESEARCH OR DEVELEOPMENT

Government Funding

This invention was made in party with support from the United States Government, under contract number F33615-01-m-2140 awarded by the United States Air Force. The United States Government may have some rights in this invention.

BACKGROUND OF THE INVENTION

1. Field of the Invention

The present invention relates to nanocomposite dielectrics of carbon nanotubes, high energy density capacitors of carbon nanotubes, and methods for increasing the dielectric constant of a polymer matrix with nanocomposite dielectrics.

2. Description of the Background

Escalating requirements for size efficiency demanded by commercial and military for ground, medical, aircraft and space power systems demand reduced size for components such as capacitors. Power loss of system components impedes size reduction. Future requirements of system size and energy density demand stress capability as well as dielectric constant of film dielectrics to be extended to higher ranges than currently available.

Several parameters are considered important factors for design and fabrication of advanced high energy density capacitors such as dielectric breakdown strength, dielectric constant, and dissipation factor. For high energy density capacitors, as in all capacitors, the total stored energy per unit volume is a function of two key properties of the dielectric, dielectric constant and the dielectric breakdown strength. The total energy density is proportional to the square of the dielectric strength and linearly proportional to the dielectric constant, as shown below in equation 1: Energy Density (ED)=$E^2 \in /8\pi$ wherein $\in$ is the dielectric constant, and E is the operating electric stress.

Power density is proportional to voltage peak energy density times the AC voltage frequency. Therefore, for high energy density capacitors, dissipation factor should be kept to a minimum. One approach for increasing stored energy density of a capacitor is to increase the capability of a dielectric to withstand higher peak voltage stresses. Key material properties for capacitor dielectrics is outlined below in Table 1.

TABLE 1

| Key material properties for high energy density pulse power capacitor dielectrics | |
|---|---|
| Dielectric breakdown strength | high, >20,000 V/mil |
| Dielectric Constant | >4 |
| Dissipation factor | <3% for light duty (<~1/min.); <1% for medium rep rate |
| Consistency | Roughness <5% of dielectric thickness; void free |
| Practicality | Should be able to fabricate into capacitors by integration into current production methods at minimal cost and investment |

The ultimate energy storage in a capacitor varies by the square of the operating voltage; therefore doubling this voltage gives a four-fold increase in energy storage. However, doubling the capacitance, by doubling the dielectric constant, only give a two-fold increase in energy storage.

Compact, high-temperature and high energy density (HED) capacitors have a myriad of uses in both commercial and military applications. For example, these may be used with domestic utilities and appliances, well-drilling equipment, power supplies, aircraft, satellites, trains, automobiles and medical devices. The high-temperature capability of the capacitors allows electronic devices to be mounted close to aircraft engines. This permits more sophisticated engine actuators, sensors and controls to be implemented with a net reduction in weight achieved through the reduction, or even elimination, of wiring hardware that is necessary when the electronics are remotely located. High-energy density capacitors are also greatly needed for Air Force and Army pulse power applications.

Y. Rao, J. Qu, C. P. Wong, IEEE Trans. on CPMT, 23, 680, December 2000. briefly reviewed the market need for integral decoupling capacitors (a.k.a., embedded capacitance) for hand held devices and computers and predict that by 2004–2006, these applications will require Capacitance per unit area of 20 and 72 $nF/cm^2$ respectively.

The standard relationship between Capacitance C and dielectric constant $\in_r$ is as follows:

$$C = \in_0 \in_r A/t$$

where $\in_0$ dielectric constant of free space ($8.854 \times 10^{-12}$ F/m)

$\in_r$ dielectric constant of the inculator layer (dimensionless)

A area of the electrical conductor t thickness of the insulator layer

According to this relationship, the dielectric constant of the insulator layer should be as high as 114 in order to achieve capacitance of 20 $nF/cm^2$. Dielectric constant values as high as 82 for composites comprising lead magnesium niobate-lead titanate in an epoxy matrix have been demonstrated. Filler loadings as high as 80 volume % were required, resulting in composites with poor mechanical properties. Dielectric constants can be predicted for these types of composites using Effective-Medium Theory.

Accordingly, traditional approaches of filling high dielectric constant fillers into a polymer matrix require 80 volume % filler loading to achieve a composite dielectric constant of 82. Thus, polymer-ceramic composites have practical limits.

Furthermore. for miniaturized GPS adaptive antenna array applications, a dielectric constant must be high enough to allow for sufficient size reduction of a patch antenna to fit their physical space requirements, which are four antenna elements need to fit in a 3.5" square array aperture. If an artificial dielectric with a high enough dielectric constant was commercially available, it would be directly applicable to this application.

(see:http://www.mitre.org/support/papers/tech_papers99_00/rao_characterizing/rao_characterizing.pdf)

Accordingly, a novel nanocomposite dielectric with a high dielectric constant is desired. A high energy density capacitor which can meet commercial and military demands is also particularly desirable.

SUMMARY OF THE INVENTION

Accordingly, in a preferred embodiment, the invention provides a nanocomposite dielectric comprising a polymer matrix and a plurality of carbon nanotubes dispersed therein.

In another preferred embodiment, the invention provides a high energy density (HED) capacitor comprising a polymer matrix and a plurality of carbon nanotubes substantially dispersed therein.

In another preferred embodiment, the invention provides a circuit comprising a high energy density (HED) capacitor of the instant invention.

In another preferred embodiment, the invention provides a method for increasing a dielectric constant of a polymer matrix, comprising dispersing a plurality of carbon nanotubes in said polymer matrix to form a nanocomposite dielectric and measuring the dielectric constant of said nanocomposite dielectric.

In another preferred embodiment, the invention provides a laminate comprising a nanocomposite dielectric of the instant invention. Preferably, a metal layer is bonded to at least one side of the dielectric. Preferably, the laminate is incorporated into a multilayer circuit structure to form an embedded capacitor. Preferably, the dielectric is reinforced with glass fabric. Preferably, the dielectric is greater than about 0.002 mm thick.

In another preferred embodiment, the invention provides a mobile antenna comprising a nanocomposite dielectric of the instant invention. Preferably, a dielectric constant of said dielectric increases as size of said antenna decreases.

Preferably, the plurality of carbon nanotubes are substantially single walled carbon nanotubes.

Preferably, the plurality of carbon nanotubes are substantially multi-walled carbon nanotubes.

Preferably, the plurality of carbon nanotubes are a mixture of single walled and multi-walled nanotubes.

Preferably, the polymer matrix is selected from the group consisting of epoxy resins, cyanate ester resins, polyimides, silicones, polybutadiene resins, fluoropolymers, urethanes, acrylics, polycarbonate, polypropylene, polyethylene, polyesters and mixtures thereof.

Preferably, the plurality of carbon nanotubes are oriented parallel to an electric field of the nanocomposite.

Preferably, a metal coating is deposited on the surface of said nanotubes to increase conductivity of said nanotubes.

Preferably, the metallic coating is selected from the group consisting of silver, gold, copper, nickel, aluminum and mixtures thereof.

Preferably, the nanotubes are present at a concentration below a percolation threshold of said nanocomposite dielectric.

Preferably, the nanotubes are mixed with a conductive filler selected from the group consisting of silver particles, nickel coated graphite, metallic coated glass beads, metallic coated hollow glass or ceramic spheres, copper particles, stainless steel fibers, carbon black, gold particles, aluminum particles and mixtures thereof.

Preferably, the nanotubes are mixed with inorganic dielectric particles to increase the volume resistivity of said dielectric.

Preferably, an organic molecule is adsorbed or covalently bonded to a surface of said nanotubes to improve dispersion or increase the volume resistivity of said dielectric.

Preferably, the dielectric has a volume resistivity greater than about $10^8$ ohm-cm. Preferably, the dielectric has a volume resistivity greater than about $10^{12}$ ohm-cm.

Preferably, the dielectric has a dielectric constant greater than about 4. Preferably, the dielectric has a dielectric constant greater than about 10. Preferably, the dielectric has a dielectric constant greater than about 40. Preferably, the dielectric has a dielectric constant greater than about 100.

Preferably, the dielectric has a dielectric loss less than about 0.05. Preferably, the dielectric has a dielectric loss less than about 0.02.

Preferably, the dielectric has a dielectric breakdown strength greater than about 1,000 volts/mil. Preferably, the dielectric has a dielectric breakdown strength greater than about 15,000 volts/mil. Preferably, the dielectric has a dielectric breakdown strength greater than about 20,000 volts/mil.shold of said nanocomposite dielectric.

Additional objects, features and advantages of the invention will be set forth in the description which follows, and in part, will be obvious from the description, or may be learned by practice of the invention. The objects, features and advantages of the invention may be realized and obtained by means of the instrumentalities and combination particularly pointed out in the appended claims.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF PREFERRED EMBODIMENTS

Maximum energy density is a result of a combination of increased dielectric constant and higher voltage stress. In reality, a dielectric constant is not a constant, but is rather a time/frequency dependent dielectric relaxation (see D. A. Seanor, Electrical Properties of Polymers, Academic Press, Inc., © 1982). Thus, a highly polarized response to changing electric fields should be on a time scale significantly faster than the desired time scale of energy discharge for the capacitor in order to be a useful high dielectric constant. The novel nanocomposite dielectric of the present invention has a dielectric constant that results from both an dielectric constant of a polymer matrix and the instantaneous polarization of carbon nanotubes dispersed therein. Preferably, the nanotubes are dispersed substantially uniformly in the polymer matrix.

Y. Rao, C. P. Wong, "Ultra High K Polymer Based Composite for Embedded Capacitor Application", demonstrated that dielectric constants as high as 1,000 can be achieved by using conductive fillers dispersed in an epoxy matrix. This was achieved at ~11 volume % filler loading. The dielectric loss for this composite was also moderately low at 0.019. The dielectric properties were measured at relatively low frequency (10 kHz), so loss would likely be much higher at microwave frequencies (1 GHz and higher). This reference clearly validates an artificial dielectric approach to trying to achieve embedded capacitance in next generation electronic products.

The instant invention is advantageous over conventional artificial dielectric approaches with regard to cost, ease of processing and mechanical properties. The instant invention operates in a much lower filler loading range, which minimizes negative impact on processing since lower viscosity should be possible and mechanical properties such as higher strength and higher ductility should be possible.

The selection of the polymer matrix is not critical. In general, any polymer can be used which is a dielectric and can uniformly disperse carbon nanotubes. The specific application will generally dictate which polymer matrix is used. For example, for circuit board or wiring board applications, a polymer matrix is preferably selected from an epoxy fiberglass resin. Selection of the polymer matrix is well within the skill of the skilled worker and within the scope of the invention.

The polymer matrix may comprises a polymer selected from one or more of the materials commonly used for electronics packaging, including, but not limited to epoxy resins, cyanate ester resins, polyimides, silicones, polybutadiene resins, fluoropolymers, urethanes, acrylics, polycarbonate, polypropylene, polyethylene, polyesters and combinations thereof.

Indeed, the recent discovery of carbon nanotubes offers new possibilities to modify the electrical properties of the polymer matrix system. Carbon nanotubes are a highly ordered, high aspect ratio, forms of carbon with extreme mechanical, electrical, and thermal properties. Their integration into nanocomposites for electronics will lead to the next generation capacitors.

Figure 6:
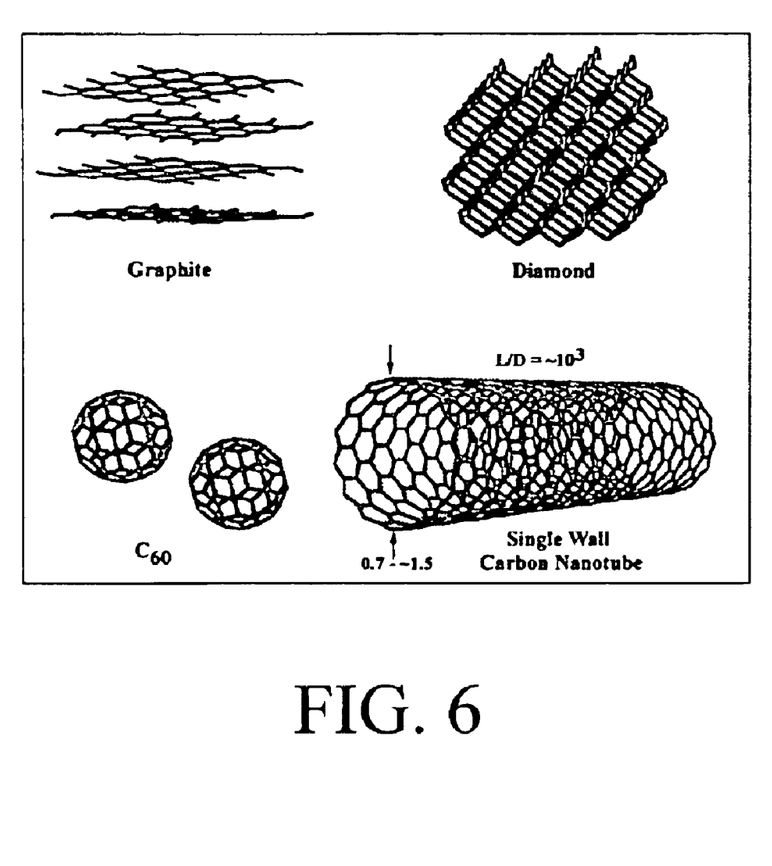
FIG. 6 depicts known carbon nanotubes.

Although only first widely reported in 1991, carbon nanotubes are now readily synthesized in gram quantities. Carbon nanotubes are essentially single graphite layers wrapped into tubes that exist as either single walled (SWCNT) or multi-walled (MWNT) wrapped in several concentric layers, as shown in FIG. 6. SWCNTs are composed of a single wall of hexagonally bonded graphene sheet (graphite is made of graphene sheets stacked like pancakes). Like the archetypal fullerene, $C_{60}$, they divide space into two volumes, an inside and an outside, separated by a chemically robust, one-atom thick, impermeable membrane. The perfection of the bonding of this graphene membrane gives such fullerene carbon nanotubes outstanding properties, including: electrical conduction equivalent to metals like copper and gold; thermal conductivity along the tube axis equal to or better than that of any other material; a tensile strength expected to be higher than any other material; 30–100 times higher strength than steel at one-sixth the weight; and extreme stiffness combined with ability to withstand repeated bending, buckling, twisting, and/or compression at high rates with complete elasticity.

Carbon nanotubes have three major assets for potential technological applications: (1) electrical properties; (2) thermal properties; and (3) extremely high mechanical strength.

Wetting of multiwall and single wall carbon nanotubes is common in the art. Wetting of nanotubes is a criterion for dispersion. One material will "wet out" another material if the resulting surface tension at the interface of the two materials is below the critical surface tension for wetting the dispersed material. Most organic compounds and resin systems wet both single and multi-walled nanotubes. Most common organic solvents, monomers, and pharmaceuticals will even wet into the hollow interior of nanotubes.

In a preferred embodiment, a metallic coating is added to the surface of the nanotubes to increase the conductivity of the nanotubes. The metallic coating may be selected from any metal commonly used as conductors in electronics packaging, including, but not limited to silver, gold, copper, nickel, and aluminum. For example, U.S. Pat. No. 6,013,206 discusses a process for synthesizing lipid tubules and coating the tubules with metal to render them conductive. The tubules are microscopic hollow cylinders that self assemble from lipids. Typical dimensions are ~0.5 $\mu$m diameter and L/D ~100. Without the metallic coating, the lipid tubules are non-conductive. By mixing these metallized tubules at very high loadings with polymers, they were able to produce polymer composites with interesting dielectric properties. The metallized tubules at high loading densities in composites develop very high dielectric responses, which allow microwave energy to be guided and absorbed, which is a very useful property in the aerospace industry. Applications of interest to this research group are radar absorbing materials and color-based biosensors.

Accordingly, nanocomposite dielectrics comprising carbon nanotubes in a polymer matrix are enhanced by metallizing the carbon nanotubes. The metallic coating will render nanotubes more conductive, thereby making it possible to achieve even higher dielectric constant than when non-metallized nanotubes are used. These composites should have advantages over the metallized lipid tubules due to geometric considerations. For example, nanotubes are much smaller in diameter, such as ~1 nm, and have a much higher aspect ratio (>1,000), and conductivity considerations since nanotubes are intrinsically electrically conductive prior to metallization.

In another preferred embodiment, the nanotubes are oriented by exposing the films to a shearing, stretching, or elongating step or the like, e.g., using conventional polymer processing methodology. Such shearing-type processing refers to the use of force to induce flow or shear into the film, forcing a spacing, alignment, reorientation, disentangling of the nanotubes from each other greater than that achieved for nanotubes simply formulated either by themselves or in admixture with polymeric materials. Oriented nanotubes are discussed, for example in U.S. Pat. No. 6,265,466, which is incorporated herein by reference in its entirety. Such disentanglement can be achieved by extrusion techniques, application of pressure more or less parallel to a surface of the composite, or application and differential force to different surfaces thereof, e.g., by shearing treatment by pulling of an extruded plaque at a variable but controlled rate to control the amount of shear and elongation applied to the extruded plaque.

Oriented refers to the axial direction of the nanotubes. The benefits of orientation are discussed, for example, in "The permittivity at X-band frequencies of nickel-coated graphite fibers in an epoxy matrix," Y.-S. Ho and P. Schoen, J. Matl. Research, 9, 246–251 (1994), wherein the authors demonstrate nickel-coated graphite fibers dispersed in an epoxy matrix and leads to composites with high dielectric constant. Dielectric constants as high as 75 are achieved, compared with a value of 2.8 for the unfilled epoxy. Fiber orientation parallel to the electric field is demonstrated by showing a maximum possible fiber loading for fibers oriented perpendicular to the electric field exhibited dielectric constants less than half that of those composites comprising fibers oriented parallel to the electric field. Lastly, the reference discusses benefits of adding a non-conductive inorganic filler to the system to facilitate dispersion and serve as a physical barrier preventing fibers from coming into physical contact. The resulting composites exhibited lower dielectric loss than composites without the fumed silica.

Preferably, the nanotubes are oriented parallel to the electric field. This type of orientation is advantageous since carbon nanotubes have a high aspect ratio compared with fibers used by the prior art since nanotubes have an aspect ration of greater than 1,000, whereas the aspect ratio for prior art nickel-coated graphite fibers is 100 or less. High dielectric constants are realized with a carbon filled polymer composite with low dielectric loss. The higher dielectric constant may be due to geometric considerations, such as a smaller diameter and much higher aspect ratio.

The instant inventors have discovered that suspending elongated, conducting objects, such as carbon nanotubes within the matrix, enhances the dielectric constant of insulating matrix material, such as plastic. The polarizability of the conducting nanotubes enhance the dielectric constant of the composite, κc. If the volume-filling fraction of the objects is too high, however, the conducting objects begin to touch, thereby forming conducting paths within the volume of the matrix, a process known as percolation. Percolation materials have significant values of bulk electrical conductivity, and therefore can be used for electrostatic-discharge or electromagnetic-shielding applications. They generally cannot, however, be used to make capacitors because their losses are too high. The loss is given by the loss tangent: tan δ=κc"/κc' which is preferably low enough for capacitor applications.

In the context of the instant invention, the amount of carbon nanotubes added to the polymer is such that the instant dielectric has a dielectric loss preferably less than or equal to 0.05 for capacitor applications. More preferably, the instant dielectric has a dielectric loss less than about 0.02.

In a preferred embodiment, an organic molecule is adsorbed or covalently bonded to a surface of said nanotubes to improve dispersion or increase the volume resistivity of said dielectric.

In a preferred embodiment, the instant dielectric has a volume resistivity greater than about $10^7$ ohm-cm, and preferably greater than about $10^9$ ohm-cm. More preferably, the volume resistivity greater than about $10^{12}$ ohm-cm.

In a preferred embodiment, the instant dielectric has a dielectric constant greater than about 4. More preferably, the dielectric has a dielectric constant greater than about 10. Even more preferably, the dielectric has a dielectric constant greater than about 40. Even more preferably still, the dielectric has a dielectric constant greater than about 100.

In a preferred embodiment, the dielectric has a dielectric breakdown strength greater than about 1,000 volts/mil. More preferably, the dielectric has a dielectric breakdown strength greater than about 15,000 volts/mil. Even more preferably, the dielectric has a dielectric breakdown strength greater than about 20,000 volts/mil.

In a preferred embodiment nanotubes are mixed with a conductive fillers selected from one or more materials commonly used for electronics packaging, including, but not limited to silver particles, nickel coated graphite, metallic coated glass beads, metallic coated hollow glass or ceramic spheres, copper particles, stainless steel fibers, carbon black, gold particles, aluminum particles.

In another preferred embodiment, the invention provides a laminate comprising a nanocomposite dielectric of instant invention. In a preferred embodiment a metal layer, such as copper foil, is bonded to at least one side of the dielectric. The laminate may be incorporated into a multilayer circuit structure to form an embedded capacitor. Preferably, the dielectric is reinforced with glass fabric and is greater than about 0.002 mm thick.

There remains an increased need for high-dielectric constant materials for the development of miniaturized antennas for mobile communications such as mobile phones, GPS and bluetooth communications systems.

Accordingly, in another preferred embodiment, the instant invention provides a mobile antenna comprising a nanocomposite dielectric of the instant invention. Preferably, the dielectric constant of the dielectric increases as size of said antenna decreases, based on antenna theory, the design width of a antenna is given by:

$$W=(\tfrac{1}{2}f_r(\mu_0 \in_0)^{1/2})(2/(\in_r+1))^{1/2}$$

where $f_r$ Operating frequency for the antenna (or resonant frequency);

$\mu_0$ and $\in_0$ Fundamental physical constants;

$\in_r$ Dielectric constant of the substrate.

Accordingly, the width of the antenna is inversely proportional to the square root of the dielectric constant. Similarly, the length of the patch antenna also is inversely proportional to the square root of the dielectric constant. Therefore, a dielectric constant of 100 should result in a $(100/10)^{1/2}$ or >3-fold reduction in both length and width of the antenna compared with a dielectric constant of 10 (alumina substrate). This would translate into an area (L×W) reduction of 10-fold. See: Garg, Ramesh; Bhartia, Prakash; Bahl, Inde; Ittipiboon, Apisack; *Microstrip Antenna Design Handbook*, Artech House, Inc. 2001.

Figure 1:
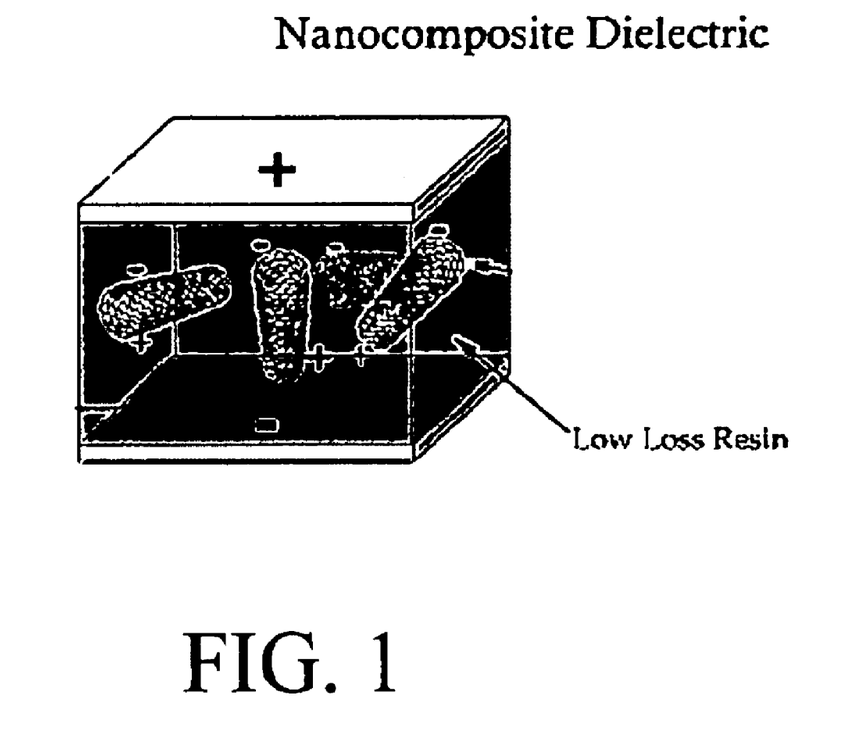
FIG. 1 depicts a HED Capacitor based on a nanocomposite dielectric according to one embodiment of the present invention.

The preferred embodiment of the present invention and its advantages are best understood by referring to the Figures of the drawings, like numerals being used for like and corresponding parts of the various drawings. In this connection, a schematic of a nanocomposite dielectric according to one embodiment of the present invention is depicted in FIG. 1.

According to another embodiment of the present invention, a method for producing dielectric films is provides. Purified carbon nanotubes are compounded into a desired polymer, cast into films, oriented, metallized, and tested.

In a preferred embodiment, the addition of carbon nanotubes to the polymer host is carefully controlled to provide a uniformly dispersed nanocomposite with a concentration of nanotubes below the percolation threshold. Some samples of the instant nanocomposite may be formed in thicker preparations to facilitate high frequency testing. These films may be characterized for electrical, morphological, and thermal properties.

In general, to prepare a nanocomposite resin, two steps are followed: 1) the acquisition of carbon nanotubes and characterization, and 2) the dispersion of the tubes into one or more resins for use in fabrication thin films and monolithic solids for testing. Each of these steps is discussed herein.

Nanotubes may come in many conductivities, purities, length distributions, diameters distributions, and are delivered in numerous forms, such as being suspended in toluene as a slurry. It is this variability in the sources of nanotubes, which requires some degree of internal testing to characterize the basic properties.

Figure 7:
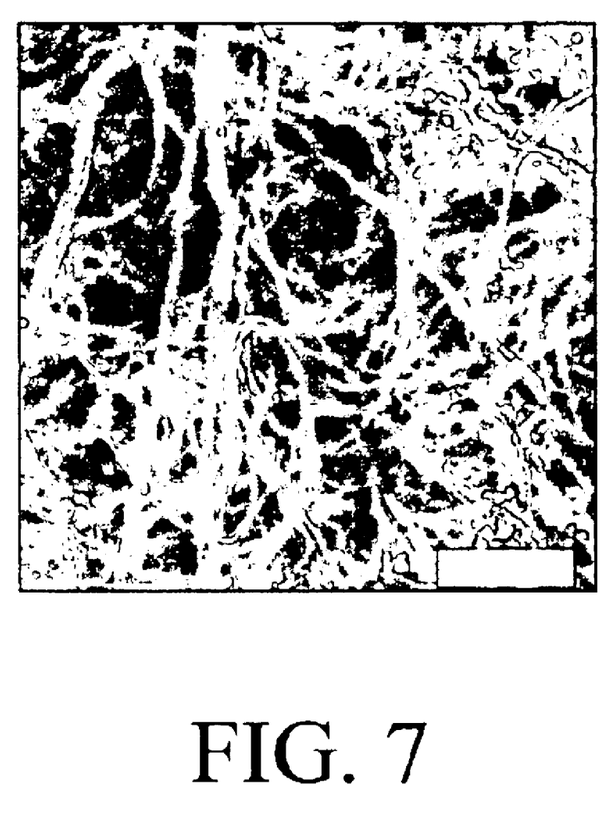
FIG. 7 depicts a SEM of SWCNT, including ropes and particles of catalyst and amorphous carbon.

In order to characterize the nanotubes, they are viewed under SEM and TEM to assess the diameters, lengths and purity, see FIG. 7. Some synthetic processes yield nanotubes with by-product, such as an HiPCO process, which may result in metal catalyst at a loading of 2–4% and may have some amount of amorphous carbon.

The nanotubes may be dispersed in a solvent of resins. Prevention of flocculation of the tubes to form ropes is desirable as shown in FIG. 9. Preferably, an aprotic organic solvent is used, such as NMP, DMAC, or DMSO, which form stable suspensions lasting several hours, which is long enough to cast films. The selection of polymer resin host is less important than the forming a uniform dispersion.

Compounding is performed by either ultrasonic or high shear mixing techniques. A range of nanotube loading levels may be prepared. Solutions may be monitored by an optical microscope to determine aggregation. The resulting solutions may be used as is for electrical measurements at high frequency.

Capacitors may be formed by casting films, forming monoliths, and metal coating. The resulting capacitors and bulk pieces may be characterized for dielectric properties and quality of dispersion by microscopy. In this connection, the invention also encompasses circuits, circuit boards or wire boards comprising the instant nanocomposite dielectric materials.

Film casting may be performed in specialized dishes, using doctor blades. By controlling the cast thickness, concentration of the resin, and environment around the cast resin, drying is uniform and results in excellent films. These films may be made very thin by using dilute solutions. Thick parts may be formed by layering films and vacuumed pressing the thermoplastic sheets together to form a solid.

The films may be sputter-coated with gold to form electrodes for measuring dielectric constant, and loss factor. Break-down strength can be determined with or without electrodes.

Measuring high-frequency complex dielectric constants (0.2–20 GHz), may be preformed with the following equipment: (1) HP 85070B dielectric probe; and (2) HP 8720C network analyzer. For measuring low-frequency complex dielectric constant (5 Hz–13 MHz), may be preformed with the following equipment: (1) HP 16451B dielectric test fixture; and (2) HP 4192A LF impedance analyzer.

Breakdown testing is a bulk material property that is dependent on test apparatus and conditions like humidity. Therefore, breakdown testing is performed to all samples and control samples in series on the same day to reduce day-to-day variability. In this way, a reference value for comparison may be provided.

For a high-energy density capacitor, the dielectric constant, loss factor, and operational voltage all determine the end use and ultimate storage capacity. Of these three, the most important may be operating voltage. The energy stored in a capacitor is calculated from the following expression:

$$W(j) = C \times V^2$$

where:
- W is in joules
- C is capacitance in Farads, and
- V is Volts.

The dielectric properties of the nanocomposite may be tested under various conditions, ranging from static to high frequency conditions. According to one embodiment of the present invention, the addition of nanotubes to the polymer host is carefully controlled to provide a uniformly dispersed nanocomposite with concentration of nanotubes below the percolation threshold as discussed herein.

The thickness of the instant composites may be varied in order to facilitate high frequency testing. The films may be characterized for electrical, morphological, and thermal properties. The dielectric system provides very unique electrical properties with a greatly enhanced dielectric constant. In this way, the invention provides a new generation of capacitor dielectric materials that demonstrate that the addition of a nanoscopic highly conductive, high aspect ratio particles to a high breakdown strength, low loss polymer host greatly enhances the dielectric constant without increasing loss or decreasing breakdown strength.

For decades, materials scientist and engineers have been exhaustively exploring all forms of materials for use in capacitors. Enormous strides toward improving the energy storage capability have already been attained. However, in the context of HED capacitors, new weapons systems require energy storage and delivery at unprecedented magnitudes.

In another preferred embodiment, the invention provides a next generation of HED capacitors comprising a nanocomposite materials to exploit synergistic contributions between established high performance bulk dielectric materials and non-intuitive engineering of materials with unique properties at the nano-scale. In this regard the invention provides an HED capacitor comprising a nanocomposite dielectric material comprising a polymer matrix having a plurality of carbon nanotubes dispersed substantially uniformly therein.

Figure 2:
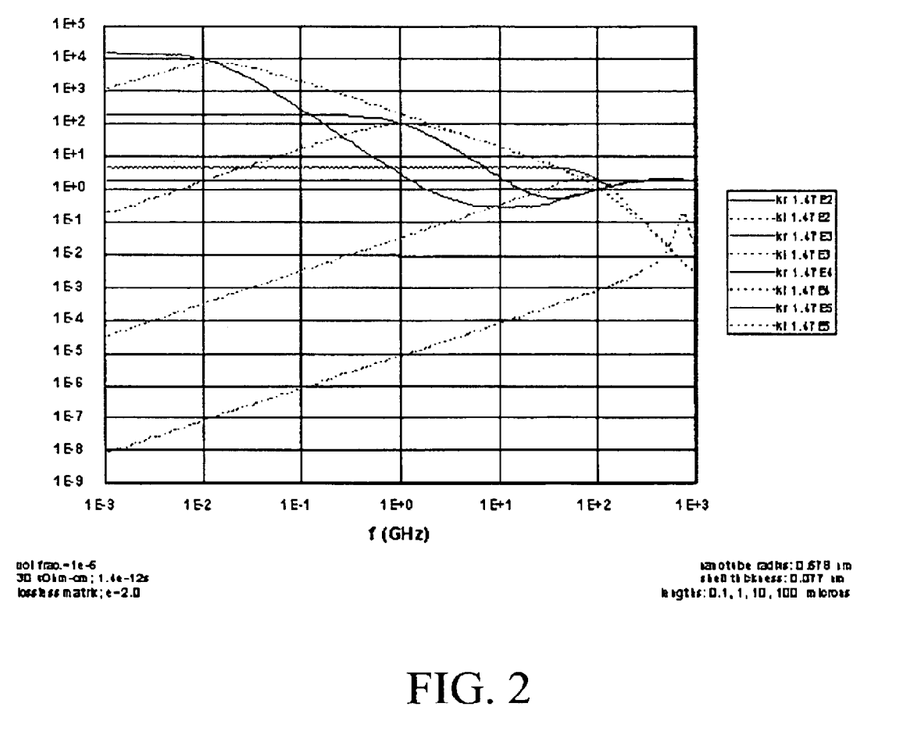
FIG. 2 depicts calculations of κc for SWCNT of several lengths below percolation according to one embodiment of the present invention.

FIG. 2 shows the results of effective-medium calculations of $\kappa c$ for single-wall metallic carbon nanotubes of several lengths below percolation. FIG. 2 shows that $\kappa c$ can be greatly enhanced for large values of nanotube aspect ratio (length/radius). This figure also shows that, for example, tan $\delta$ is less than 0.01 at frequencies less than 10 MHz for nanotubes that are 10 $\mu$m long and that have a resistivity of 30 $\mu\Omega \cdot$cm. Other calculations show that the upper frequency at which tan $\delta$=0.01 can be increased by decreasing the nanotube resistivity.

As discussed above, nanotube concentrations above the percolation threshold, a dielectric loss factor can be incorporated by adjusting the nanotube concentration. Below this concentration, known as the percolation threshold, nanotube composites are nonconductive, but have a high dielectric constant. Both the dielectric constant and the loss tangent, the two parameters that make up the loss factor, can be adjusted.

The dielectric response of nanotube composites is quite different from that of composites with spherical inclusions, even at small concentrations. The difference is possible due to long-range correlations in the interaction of the nanotubes. This long-range interaction is a distinct feature of high aspect ratio conductive fillers, while for spherical particle they are negligible.

The instant nanocomposites demonstrate low percolation thresholds since nanotubes have a much lower percolation threshold than typical fillers due to their high aspect ratio of >1000 and their high conductivity. For example, the calculated percolation threshold for carbon black is 4%, while the threshold is below 0.04%, or two orders of magnitude lower, for typical carbon nanotubes. A high aspect ratio of carbon nanotube affords a filler loading level far lower than that of any other composite.

Figure 3:
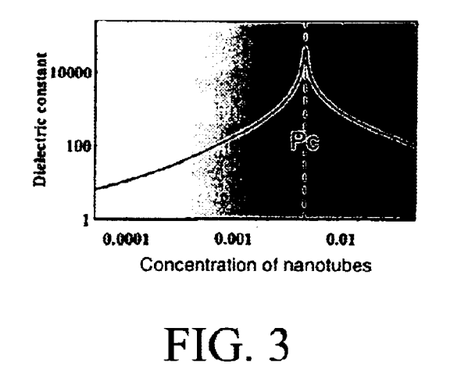
FIG. 3 depicts a plot of dielectric constant versus concentration of nanotubes in resin according to one embodiment of the present invention.

Referring to FIG. 3, the effective dielectric constant and dielectric loss for the nanotube filled layer increases dramatically near the percolation threshold and is lower at nanotube concentrations above or below this critical value (Pc). Further, the dielectric loss factor for a nanotube-filled resin as a function of concentration behaves similarly to that of the dielectric constant, increasing in value up to percolation threshold. These results are dependant on the aspect ratio and homogeneity of the nanotube within the composite.

Figure 4:
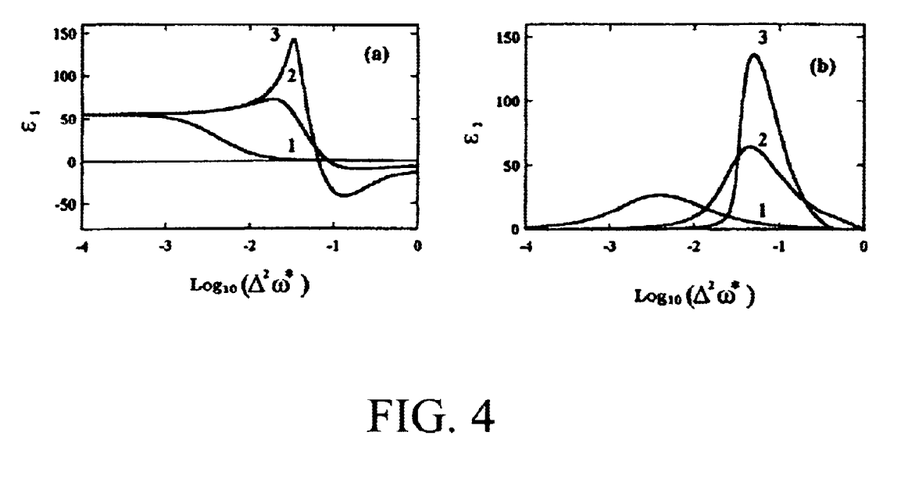
FIG. 4 depicts a plot of dielectric constant ($\in 1$) and loss ($\in 2$) versus reduced frequency according to one embodiment of the present invention.

In addition, referring to FIG. 4, the loss factor is frequency dependant. This figure depicts the dielectric constant and loss as a function dimensionless frequency. The concentration of the nanotube is 10% of that required to reach the percolation threshold. The data peaks at the resonance frequency of the nanotubes. The resonance frequency is length dependant. By selecting the correct concentration and length of nanotubes, a nanocomposite-resin for controlled behavior at a variety of frequencies can be produced.

Figure 5:
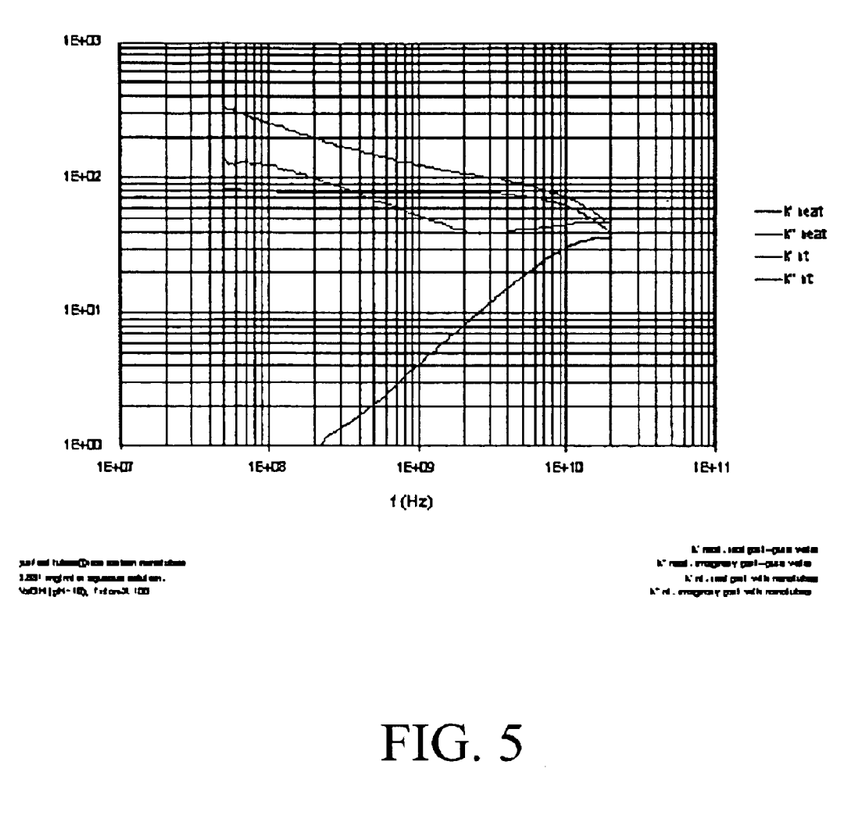
FIG. 5 depicts experimental measurements of κc as a function of frequency for carbon nanotubes suspended in water according to one embodiment of the present invention.

FIG. 5 shows experimental measurements of κc as a function of frequency for carbon nanotubes suspended in water. This data was taken at slightly below the percolation threshold. At ~50 MHz, the nanotubes increase κc' by a factor of ~4 over that of pure water, although tan δ~0.5 at this frequency, may be too high for capacitor applications. However, these results demonstrate the potential of carbon nanotubes to enhance the dielectric constants of materials, such as a polymer, that can be used to make HED capacitors.

The complex relative dielectric constant was calculated for a composite made of metallic single-wall carbon nanotubes suspended in lossless matrix with a relative dielectric constant of 2.0, close to that of many plastics. The volume filling fraction was $1 \times 10^{-5}$. The nanotube resistivity and collisional relaxation time were 30 $\mu\Omega$·cm and $1.4 \times 10^{-12}$ s, respectively. For these calculations, it is assumed that the nanotubes have the dimensions of a (10, 10) nanotube, the dimensions of the nanotubes commonly found. In this plot "kr" is the real part of the composite's complex dielectric constant, and "ki" is the imaginary part (see also FIG. 2).

The complex relative dielectric constant measured with ("nt") and without ("neat") single-wall carbon nanotubes suspended in water using a surfactant. The weight fraction of the nanotubes was 0.681 mg/ml, corresponding to a volume filling fraction of $\sim 2 \times 10^{-4}$. It appears that this data was taken at slightly below the percolation threshold. These plots show the ability of carbon nanotubes to enhance the dielectric constant of the matrix material. In this figure, k' is the real part of the complex relative dielectric constant and k" is the imaginary part.

Although only a few exemplary embodiments of the present invention have been described in detail in this disclosure, those skilled in the art who review this disclosure will readily appreciate that many modifications are possible in the exemplary embodiments (such as variations in sizes, structures, shapes and proportions of the various elements, values of parameters, or use of materials) without materially departing from the novel teachings and advantages of the invention. Accordingly, all such modifications are intended to be included within the scope of the invention as defined in the appended claims. Other substitutions, modifications, changes and omissions may be made in the design, operating conditions and arrangement of the preferred embodiments without departing from the spirit of the invention as expressed in the appended claims.

Additional advantages, features and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined bye the appended claims and their equivalents.

As used herein and in the following claims, articles such as "the", "a" and "an" can connote the singular or plural.

All documents referred to herein are specifically incorporated herein by reference in their entireties.

What is claimed is:

1. A nanocomposite dielectric comprising a polymer matrix and a plurality of carbon nanotubes dispersed therein, wherein a metal coating is deposited on a surface of said dielectric.

2. The nanocomposite dielectric of claim 1, wherein said plurality of carbon nanotubes are single walled carbon nanotubes.

3. The nanocomposite dielectric of claim 1, wherein said plurality of carbon nanotubes are multi-walled carbon nanotubes.

4. The nanocomposite dielectric of claim 1, wherein said plurality of carbon nanotubes are a mixture of single walled and multi-walled nanotubes.

5. The nanocomposite dielectric of claim 1, wherein said polymer matrix is selected from the group consisting of epoxy resins, cyanate ester resins, polyimides, silicones, polybutadiene resins, fluoropolymers, urethanes, acrylics, polycarbonate, polypropylene, polyethylene, polyesters and mixtures thereof.

6. The nanocomposite dielectric of claim 1, wherein said plurality of carbon nanotubes are oriented parallel to an electric field of the Nanocomposite.

7. The nanocomposite dielectric of claim 1, wherein the metal coating increases conductivity.

8. The nanocomposite dielectric of claim 1, wherein said metallic coating is selected from the group consisting of silver, gold, copper, nickel, aluminum and mixtures thereof.

9. The nanocomposite dielectric of claim 1, wherein said nanotubes are present at a concentration below a percolation threshold of said nanocomposite dielectric.

10. The nanocomposite dielectric of claim 1, wherein said nanotubes are mixed with a conductive filler selected from the group consisting of silver particles, nickel coated graphite, metallic coated glass beads, metallic coated hollow glass or ceramic spheres, copper particles, stainless steel fibers, carbon black, gold particles, aluminum particles and mixtures thereof.

11. The nanocomposite dielectric of claim 1, wherein said nanotubes are mixed with inorganic dielectric particles to increase the volume resistivity of said dielectric.

12. The nanocomposite dielectric of claim 1, wherein an organic molecule is adsorbed or covalently bonded to a surface of said nanotubes to improve dispersion or increase the volume resistivity of said dielectric.

13. The nanocomposite dielectric of claim 1, wherein said dielectric has a volume resistivity greater than $10^8$ ohm-cm.

14. The nanocomposite dielectric of claim 1, wherein said dielectric has a volume resistivity greater than $10^{12}$ ohm-cm.

15. The nanocomposite dielectric of claim 1, wherein said dielectric has a dielectric constant greater than 4.

16. The nanocomposite dielectric of claim 1, wherein said dielectric has a dielectric constant greater than 10.

17. The nanocomposite dielectric of claim 1, wherein said dielectric has a dielectric constant greater than 40.

18. The nanocomposite dielectric of claim 1, wherein said dielectric has a dielectric constant greater than 100.

19. The nanocomposite dielectric of claim 1, wherein said dielectric has a dielectric loss less than 0.05.

20. The nanocomposite dielectric of claim 1, wherein said dielectric has a dielectric loss less than 0.02.

21. The nanocomposite of claim 1, wherein said dielectric has a dielectric breakdown strength greater than 1,000 volts/mil.

22. The nanocomposite of claim 1, wherein said dielectric has a dielectric breakdown strength greater than 15,000 volts/mil.

23. The nanocomposite of claim 1, wherein said dielectric has a dielectric breakdown strength greater than 20,000 volts/mil.

24. A laminate comprising a nanocomposite dielectric of claim 1.

25. A mobile antenna comprising a nanocomposite dielectric of claim 1.

26. A high energy density (HED) capacitor comprising a dielectric material comprising a polymer matrix and a plurality of carbon nanotubes substantially dispersed therein, wherein a metal coating is deposited on a surface of said capacitor.

27. The high energy density (HED) capacitor of claim 26, wherein said plurality of carbon nanotubes are single walled carbon nanotubes.

28. The high energy density (HED) capacitor of claim 26, wherein said plurality of carbon nanotubes are multi-walled carbon nanotubes.

29. The high energy density (HED) capacitor of claim 26, wherein said plurality of carbon nanotubes are a mixture of single walled and multi-walled nanotubes.

30. The high energy density (HED) capacitor of claim 26, wherein said polymer matrix is selected from the group consisting of epoxy resins, cyanate ester resins, polyimides, silicones, polybutadiene resins, fluoropolymers, urethanes, acrylics, polycarbonate, polypropylene, polyethylene, polyesters and mixtures thereof.

31. The high energy density (HED) capacitor of claim 26, wherein said plurality of carbon nanotubes are oriented parallel to an electric field of the nanocomposite.

32. The high energy density (HED) capacitor of claim 26, wherein a metal coating is deposited on the surface of said nanotubes to increase conductivity of said nanotubes.

33. The high energy density (HED) capacitor of claim 26, wherein said nanotubes are present at a concentration below a percolation threshold of said nanocomposite dielectric.

34. A circuit comprising a high energy density (HED) capacitor of claim 26.

35. A method for increasing a dielectric constant of a polymer matrix, comprising dispersing a plurality of carbon nanotubes in said polymer matrix to form a nanocomposite dielectric, wherein a metal coating is deposited on a surface of said polymer matrix, and measuring the dielectric constant of said nanocomposite dielectric.

36. The method of claim 35, wherein said plurality of carbon nanotubes are single walled carbon nanotubes.

37. The method of claim 35, wherein said plurality of carbon nanotubes are multi-walled carbon nanotubes.

38. The method of claim 35, wherein said plurality of carbon nanotubes are a mixture of single walled and multi-walled nanotubes.

39. The method of claim 35, wherein said polymer matrix is selected from the group consisting of epoxy resins, cyanate ester resins, polyimides, silicones, polybutadiene resins, fluoropolymers, urethanes, acrylics, polycarbonate, polypropylene, polyethylene, polyesters and mixtures thereof.

40. The method of claim 35, wherein said plurality of carbon nanotubes are oriented parallel to an electric field of the nanocomposite.

41. The method of claim 35, wherein a metal coating is deposited on the surface of said nanotubes to increase conductivity of said nanotubes.

42. The method of claim 35, wherein said nanotubes are present at a concentration below a percolation threshold of said nanocomposite dielectric.

43. The laminate of claim 24, wherein a metal layer is bonded to at least one side of the dielectric.

44. The laminate of claim 24, wherein said laminate is incorporated into a multilayer circuit structure to form an embedded capacitor.

45. The laminate of claim 24, wherein said dielectric is reinforced with glass fabric.

46. The laminate of claim 24, wherein said dielectric is greater than 0.002 mm thick.

47. The laminate of claim 24, wherein said metal layer is copper foil.

48. The mobile antenna of claim 46, wherein a dielectric constant of said dielectric increases as size of said antenna decreases.

* * * * *